United States Patent
Gregorius (10) Patent No.: US 7,378,892 B2
(45) Date of Patent: May 27, 2008

(54) DEVICE FOR SETTING A CLOCK DELAY

(75) Inventor: Peter Gregorius, München (DE)

(73) Assignee: Infineon Technologies AG, Munich (DE)

( * ) Notice: Subject to any disclaimer, the term of this patent is extended or adjusted under 35 U.S.C. 154(b) by 200 days.

(21) Appl. No.: 11/194,509

(22) Filed: Aug. 1, 2005

(65) Prior Publication Data

US 2006/0022736 A1   Feb. 2, 2006

(30) Foreign Application Priority Data

Jul. 30, 2004   (DE) .................. 10 2004 037 163

(51) Int. Cl.
*H01H 11/26*   (2006.01)
*H03K 5/22*   (2006.01)

(52) U.S. Cl. .................. 327/276; 327/26; 327/263; 327/284

(58) Field of Classification Search .................. 327/26, 327/263, 276, 284, 277, 149, 153, 158, 161
See application file for complete search history.

(56) References Cited

U.S. PATENT DOCUMENTS 6,720,810 B1   4/2004   New

2002/0141527 A1   10/2002   Song
2004/0051576 A1*   3/2004   Zhang et al. .............. 327/276
2005/0140416 A1*   6/2005   Rashid ...................... 327/277

FOREIGN PATENT DOCUMENTS

JP   2004165960 A   6/2004

* cited by examiner

*Primary Examiner*—Quan Tra
*Assistant Examiner*—Colleen O'Toole
(74) *Attorney, Agent, or Firm*—Maginot, Moore & Beck (57) ABSTRACT

A device for setting a clock delay is proposed, wherein delayed output clock signals are generated with the aid of delaying means by delaying an input clock signal. The delaying means are configured to provide several differently delayed clock signals simultaneously. The device is configured to generate the at least one output clock signal depending on the differently delayed clock signals with a settable phase relationship to the non-delayed input clock signal, wherein the phase relationship is settable independently of the delay provided by the delaying means. It is particularly provided that the phase relationship between the delayed output clock signal and the non-delayed input clock signal is automatically controlled to a desired phase relationship independently of the delay supplied by the delaying means.

12 Claims, 10 Drawing Sheets

DEVICE FOR SETTING A CLOCK DELAY

FIELD OF THE INVENTION

This application claims priority from German patent application number 10 2004 037 163.6, filed Jul. 30, 2004, the contents of which are incorporated by reference herein in their entirety.

BACKGROUND

In physical interfaces for memory applications, e.g. for so-called DDR memories, various kinds of signals are used to transmit data from or to the memory and to control the memory. These are especially control clock signals, data signals and sampling signals, so-called strobe signals, and also command and addressing signals. For effective communication between the memory and the interface it is necessary to set the phase relationships of these signals mutually or relative to an external clock signal.

To set the desired phase relationships between the signals it is common to use so-called delay locked loops. These are delay-locked loops which compare a clock signal with a delayed clock signal and automatically control the delay in such a way that the phase relationship of the clock signal and the delayed clock signal adopts a fixed value. A delay-locked loop can especially also delay in a controlled manner clock-type signals which do not have full periodicity, i.e. are only periodic in sections.

Figure 8:
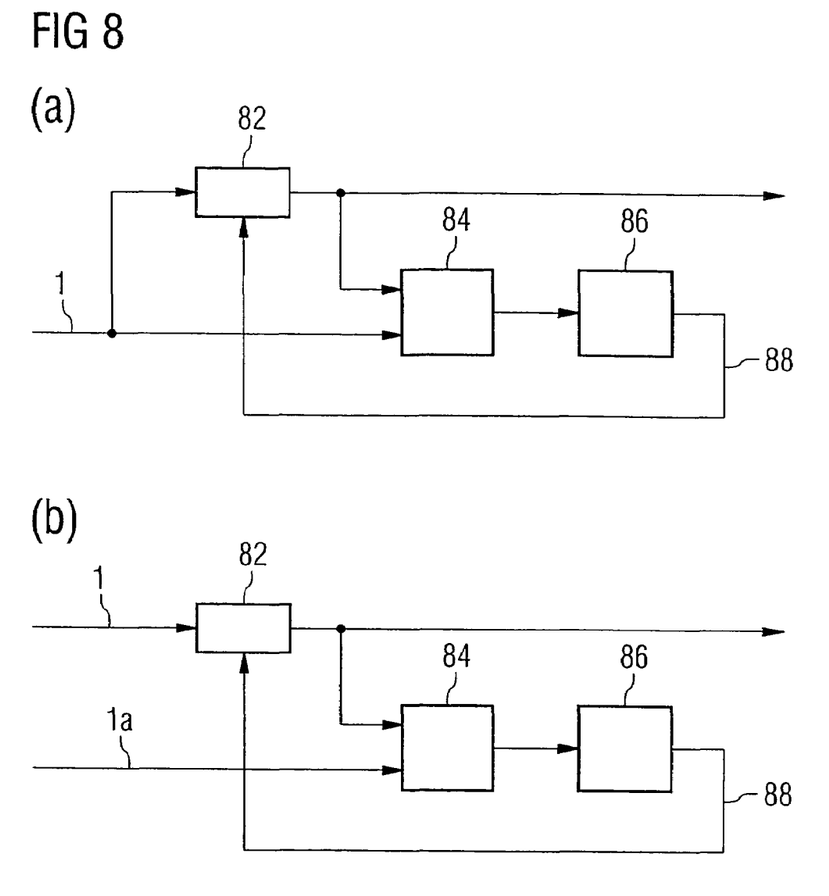
FIG. 8 depicts the basic mode of operation of a delay-locked loop, wherein in the case of FIG. 8(*a*) a reference clock signal is formed directly by the clock signal to be delayed, while in the case of FIG. 8(*b*) the reference clock signal is derived externally from the clock signal to be delayed.

Examples of delay-locked loops of this kind are illustrated in FIGS. 8(a) and (b). The delay-locked loop of FIG. 8(a) receives a clock signal 1 as input signal. The clock signal is delayed by a delaying means 82 by a specific amount of time which can be set by a control signal 88. The output signal of the delaying means 82 thus forms a delayed clock signal. The delayed clock signal is compared by comparison means 84 with the non-delayed clock signal 1 in respect of the relative phase position. An output signal of the comparison means 84, generated on the basis of the comparison of the clock signal 1 with the delayed clock signal, is fed to the delaying means 82 as the control signal 88 via a loop filter 86.

An alternative form of delay-locked loop is illustrated in FIG. 8(b). This corresponds in respect of the delaying means 82, the comparison means 84 and the loop filter 86 to the delay-locked loop already described above using FIG. 8(a). However, the difference in this case is that two clock signals 1, 1a are fed to the delay-locked loop and their phase relationship is set by the delay-locked loop. This is achieved in that clock signal 1 is delayed by the delaying means 82 in order to generate the delayed clock signal, while the delayed clock signal is compared by the comparison means 84 with clock signal 1a, which thus has the function of a reference clock signal. The difference between the delay-locked loops of FIGS. 8(a) and (b) is consequently that in one case the phase relationship is set in respect of the non-delayed clock signal 1, while in the other case the phase relationship is set in respect of the reference clock signal 1a. The reference clock signal 1a can, for example, be derived externally from clock signal 1.

It is normally necessary with memory interfaces not only that a specific phase relationship is set, but that the phase position can also be set individually in each case for the different signals. In this connection it is known to configure a device for generating clock signals with controlled delay on the so-called master-slave principle. It is usual in such cases to use a delay chain with several delay stages or elements as delaying means. In a master delay loop the delay of the delaying means is firstly adjusted in such a way that there is a fixed phase relationship between the output signal of the delaying means and the non-delayed clock signal or the reference clock signal. The actual generation of the delayed clock signals is done by slave delay loops which are constructed identically to the master delay loop, but do not have their own control loop. The control signal of the master delay loop is then used as control signal for the delaying means of the slave delay loop. A delayed output clock signal is generated in that signals are tapped from the individual delay steps of the delaying means via a multiplexer. The delayed clock signals tapped in this way normally correspond to a fixed fraction of the delay set by the master delay loop. In this way it is possible with the slave delay loops to select the desired phase relationship between the clock signal or reference clock signal and the respective delayed signal individually. It is further possible to locate the generation of delayed clock signals flexibly, for example near the place where the delayed clock signal is being used.

Figure 9:
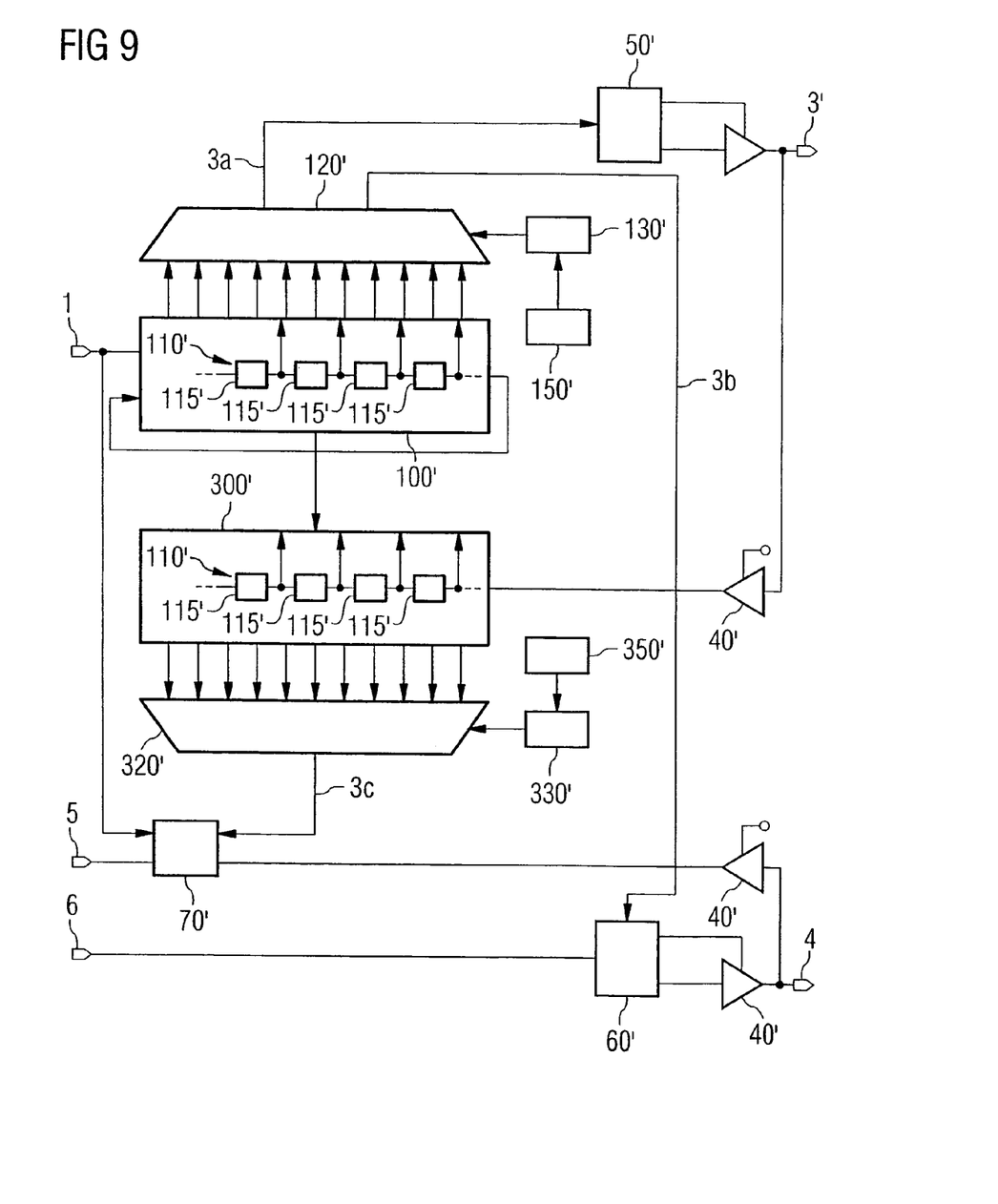
FIG. 9 shows schematically an example of a circuit block configured on the master-slave principle for generating and synchronising data and sampling signals in a memory interface.

FIG. 9 shows schematically a circuit block, configured on the master-slave principle, for generating and synchronising data and sampling signals in a memory interface for a memory device. The circuit block comprises a master delay-locked loop 100', to which a clock signal to be delayed is fed as input signal. The master delay-locked loop 100' delays the clock signal 1 by a specific amount of time, a defined phase relationship being set between the clock signal 1 and the delayed clock signal. To set the defined phase relationship the master delay-locked loop 100' internally generates a control signal via which delaying means 110' of the master delay-locked loop 100' are controlled. The control signal of the master delay-locked loop 100' is available at a signal output of the master delay-locked loop 100' and is used to control a slave delay-locked loop 300.

The delaying means 110' of the master delay-locked loop 100' and of slave delay-locked loop 300' are formed by identical delay chains with several delay elements 115'. The control signal which is generated by the master delay-locked loop 100' controls in particular the delay supplied by one of the delay elements 115' of the delaying means 110'. By tapping at the outputs of the individual delay elements 115' of the delaying means 110' both of the master delay-locked loop 100' and of the slave delay-locked loop 300', delayed clock signals can be tapped, which after adjustment of the master delay-locked loop 100' have different delays, which correspond in each case to a defined fraction of the period length of the clock signal 1. The output signals of the individual delay elements 115' are fed to multiplexers 120', 320', which generate output clock signals 3a, 3b, 3c by selecting the different delayed clock signals.

The phase relationship of the output clock signals 3a, 3b, 3c to the non-delayed clock signal is set by appropriate driving of the multiplexers 120', 320'. For this values for the desired phase relationship are selected from lists stored in a memory 150', 350' and transmitted to a control register 130', 330'. These values feed an appropriate control signal to the multiplexer 120', 320'.

Output clock signal 3a acts as input signal for a sampling signal generating block 50' which generates a sampling signal 3' on the basis of output clock signal 3a. Output clock signal 3b is fed to a synchronisation block 60' which synchronises write data signals 6, to be written into the memory, with output clock signal 3b, in order in this way to generate a memory data signal 4 synchronised with output clock signal 3b for write processes.

The master delay-locked loop 100' generates output clock signals 3a, 3b, on the basis of the non-delayed clock signal 1. The slave delay-locked loop 300', on the other hand, uses the sampling signal 3' as input signal. A delay of the not fully periodic sampling signal 3' is possible owing to the use of delay-locked loops. A desired phase relationship between the sampling signal 3' and output clock signal 3c is set for read processes by slave delay-locked loop 300'. Output clock signal 3c is fed to a synchronisation block 70' which generates a read data signal 5 synchronised with the clock signal 1 on the basis of a data signal 4 received from the memory. For this the clock signal 1 is additionally fed to the synchronisation block 70'.

For bi-directional use the arrangement of FIG. 9 is provided with switching means 40' by which signal connections, the use of which is not necessary for the intended application, i.e. for a write or a read process, can be interrupted. Feeding of the sampling signal 3' to slave delay-locked loop 300' and connection of the data memory signal 4 to the synchronisation block 70' are interrupted during write processes, for example.

Figure 10:
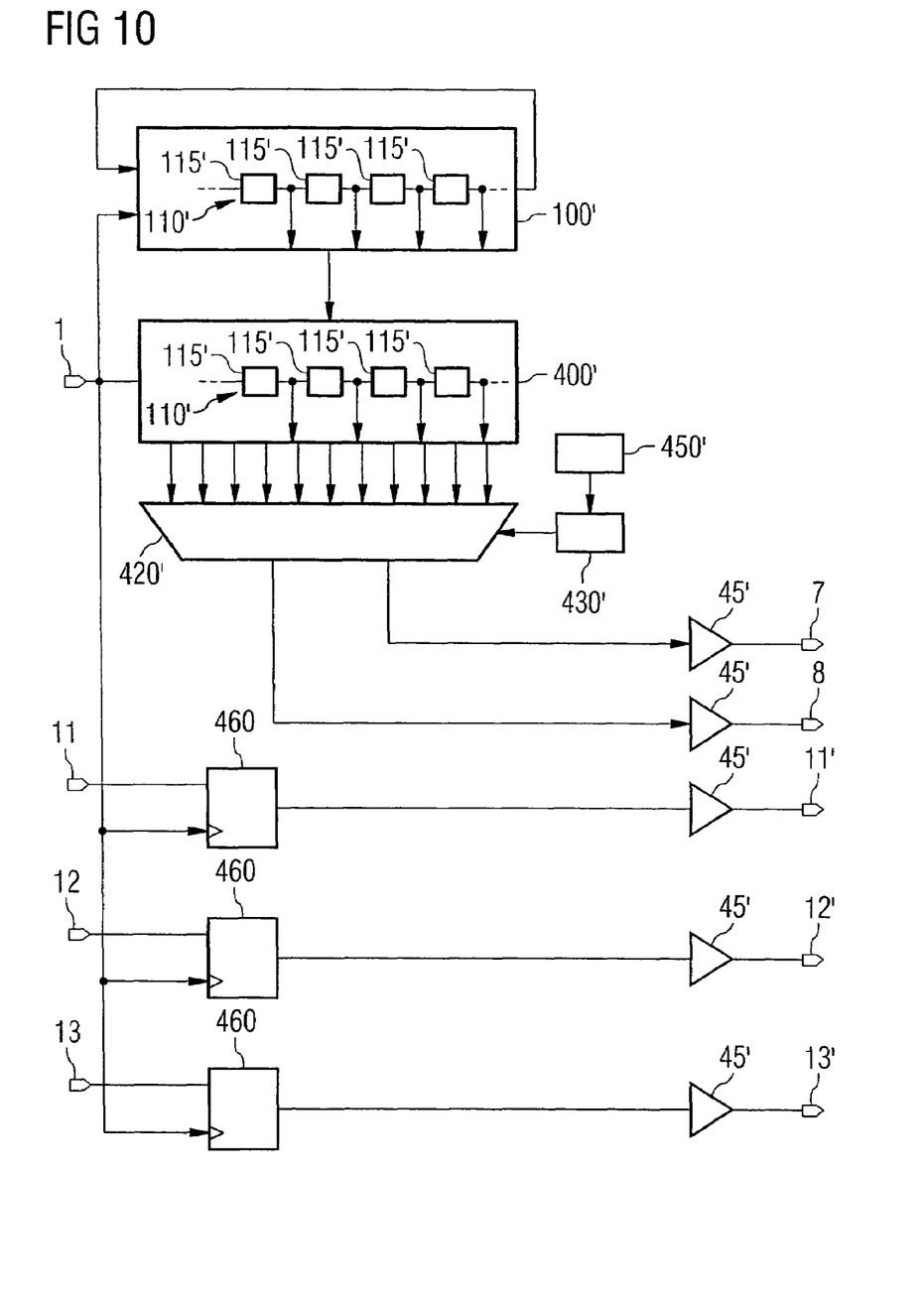
FIG. 10 shows schematically an example of a circuit block configured on the master-slave principle for generating and synchronising control clock, command and addressing signals in a memory interface.

FIG. 10 shows a further circuit block constructed on the master-slave principle for a memory interface and used for generating and synchronising control clock and command and addressing signals. The clock signal 1 is fed to a slave delay-locked loop 400' constructed similarly to slave delay-locked loop 300' of FIG. 9. Output clock signals 7, 8 of the circuit block are again generated via a multiplexer 420', to which differently delayed clock signals tapped at the individual delay elements 115' of the delaying means 110' of the slave delay-locked loop 400' are fed. The multiplexer 420' is driven corresponding to the arrangement in FIG. 9 by a control signal generated by a list stored in a memory 450' and a control register 430'. By means of this circuit block addressing and command signals 11, 12, 13 are conducted to the memory as addressing and command signals 11', 12', 13' synchronised with the clock signal 1 via flip-flop elements 460 driven by the clock signal 1. The output clock signals 7, 8 of slave delay-locked loop 400' act as control clock signals for the memory. The task of slave delay-locked loop 400' is in this case to guarantee that the control clock signals 7, 8 are synchronised with the addressing and command signals 11', 12', 13' at the location of the memory. A defined phase relationship to the sampling signal 3' and the memory data signal 4 is further necessary. In order to be able to guarantee the required signal strengths at the location of the memory the output signals of the circuit block illustrated in FIG. 10 are output via buffers or line drivers 45'.

The previously described use of the master slave principle for generating and synchronising clock, sampling and data signals and also command and addressing signals guarantees independent selection of the phase relationship for the individual output clock signals 3a, 3b, 3c, 7, 8. A problem with this known solution for setting the delay of clock signals is, however, that the desired phase relationship is preset purely statically, preferably based on an expected value for differences in delay of the individual signals. In this way problems arise in particular if the pulse-duty ratio of the clock signal 1 is subject to fluctuations. Only deviations of the phase relationships which are considerably smaller than the length of a symbol, i.e. typically of a period length of the clock signal 1 may occur. However, this requirement cannot necessarily be guaranteed, in particular for high-frequency memory media. If there are greater fluctuations of the phase shift this leads to a loss of data which can be compensated for only by complex clock and data recovery mechanisms.

A general problem in delay-locked loops is that they react sensitively to errors in the pulse-duty ratio, a so-called duty cycle distortion, which may occur both in the input-side clock signal and within the delaying means. It is further necessary that a clock signal with a high spectral purity and low noise is used as input signal.

Both analog and digital signals can be used as control signals for the delaying means. In the case of analog control signals, however, there is the problem of great sensitivity with respect to interference towards scattering in by internal or external interferers. In this case there are resulting undesired deviations or additional noise within the delaying means. Neither can these problems be avoided by embodying the control loop in differential switching technology. Especially problematical is the use of analog control signals in an arrangement constructed on the above-described master-slave principle. In this case in some circumstances the control signal has to be transmitted to the slave delay loop over a greater distance. This gives rise to increased susceptibility to interference and noise.

SUMMARY

In view of the above-described problems, the object of the present invention is to provide a device for setting a clock delay which avoids these problems, is robust in respect of the above-described interferences and can be implemented with a small outlay.

This object is achieved by a device for setting a clock delay according to embodiments of the invention.

According to the invention the device for setting a clock delay comprises delaying means which are configured to delay an input clock signal, in order to generate at least one delayed output clock signal. The delaying means are configured to simultaneously provide several differently delayed clock signals and the device is configured to generate the at least one output clock signal depending on the differently delayed clock signals with a settable phase relationship to the non-delayed input clock signal, the phase relationship being settable independently of the delay provided by the delaying means. According to the invention it is provided that the phase relationship between the output clock signal and the non-delayed input clock signal is automatically controlled to a desired phase relationship independently of the delay provided by the delaying means.

In this way setting of the desired phase relationship is done automatically and independently of the delay supplied by the delaying means. It can in this way particularly be avoided that in the event of fluctuations in the duty-cycle ratio of the input clock signal the delay of the delaying means has to be re-adjusted, which in a conventionally implemented memory interface would lead, for example, to the memory interface temporarily not being ready for operable.

The device preferably also comprises a delay-locked loop by which the delay of the delaying means is automatically controlled. A delay-locked loop of this kind in this case preferably comprises comparison means for a phase comparison of the clock signal delayed by delaying means of the delay-locked loop with a reference clock signal and control means which are configured to generate a control signal for the delaying means on the basis of an output signal of the comparison means. The delay-locked loop is preferably digitally configured, i.e. comprises both the comparison means and the control means in digital form. In this way low susceptibility to interference of the delay-locked loop is guaranteed and the construction can be simplified.

The delaying means for generating the at least one output clock signal are preferably provided independently of the delaying means of the delay-locked loop. In this way it is possible to construct the device on the master-slave principle, wherein the delaying means for generating the at least one output clock signal are controlled by the control signal of the delaying means of the delay-locked loop. For this it is preferred to configure the delaying means for generating the at least one output clock signal identically to the delaying means of the delay-locked loop.

In the case of a configuration of the device on the master-slave principle as described above, it is preferred that the reference clock signal of the delay-locked loop is provided independently of the input signal of the delaying means for generating the at least one output clock signal, preferably by a phase-locked loop. In this way, control of the delay of the delaying means is independent of the actual generation of the output clock signals and in particular less sensitive to fluctuations in the duty-cycle ratio of the input clock signal to be delayed for generating the output clock signals. The input clock signal of the delaying means of the delay-locked loop can likewise be formed by the reference clock signal of the delay-locked loop, so that only an independently generated input clock signal has to be fed to the delay-locked loop. The setting of the desired phase relationship for the at least one output clock signal is preferably done in that the delaying means comprise several delay elements, arranged in series, wherein at the output of each delay element one of the differently delayed clock signals can be tapped. The differently delayed clock signals are then preferably fed to multiplexer means which set the phase relationship between the non-delayed input clock signal and the at least one output clock signal by selecting the differently delayed clock signals. Alternatively or additionally, interpolation means may be provided, which can set a phase relationship of the at least one output clock signal by interpolation of at least two of the differently delayed clock signals. In this way it is possible, for example, to provide a rough setting via the multiplexer by selecting the differently delayed clock signals, while a fine setting takes place by interpolation of differently delayed clock signals selected via the multiplexer.

For automatically controlled setting of the phase relationship independently of the delay supplied by the delaying means, the device preferably comprises phase setting control means which are configured to generate a phase selection control signal for automatically controlled setting of the desired phase relationship depending on the output clock signal and the non-delayed input clock signal. The phase setting control means may in this case comprise a comparison means in the form of a phase detector and a control element containing in particular a loop filter. It is particularly preferred in this case to configure the phase setting control means digitally. This results in a reduced susceptibility to interference and generation of the phase selection control signal can be done directly in digital form, so the driving of the multiplexer means or interpolation means is simplified. The phase selection control signal generated by the phase setting control means is preferably used to drive the multiplexer means and/or the interpolation means.

The present invention is particularly suitable for use for generating and/or synchronising clock signals, data signals and sampling signals for a memory device.

An improved insensitivity to fluctuations in the pulse-duty ratio of the input clock signal to be delayed or of the input clock signals to be delayed and also precise automatic setting of the desired phase relationship, without having to involve for this an expected value based on differences in delay, emerge as a particular advantage of the invention. Setting of the phase relationship is simplified, without complex clock or data recovery mechanisms being needed for this.

The invention is explained in greater detail below with reference to the attached drawings using preferred embodiment examples.

BRIEF DESCRIPTION OF THE DRAWINGS

FIG. 7(*a*) depicts in a circular diagram the selection of the phase positions of output clock signals according to an exemplary embodiment of the invention and FIG. 7(*b*) depicts the use of a phase selection control signal for selecting a desired phase position of the output clock signals.

Detailed Description

In the following description the same reference symbols have been used throughout for similar components.

Figure 1:
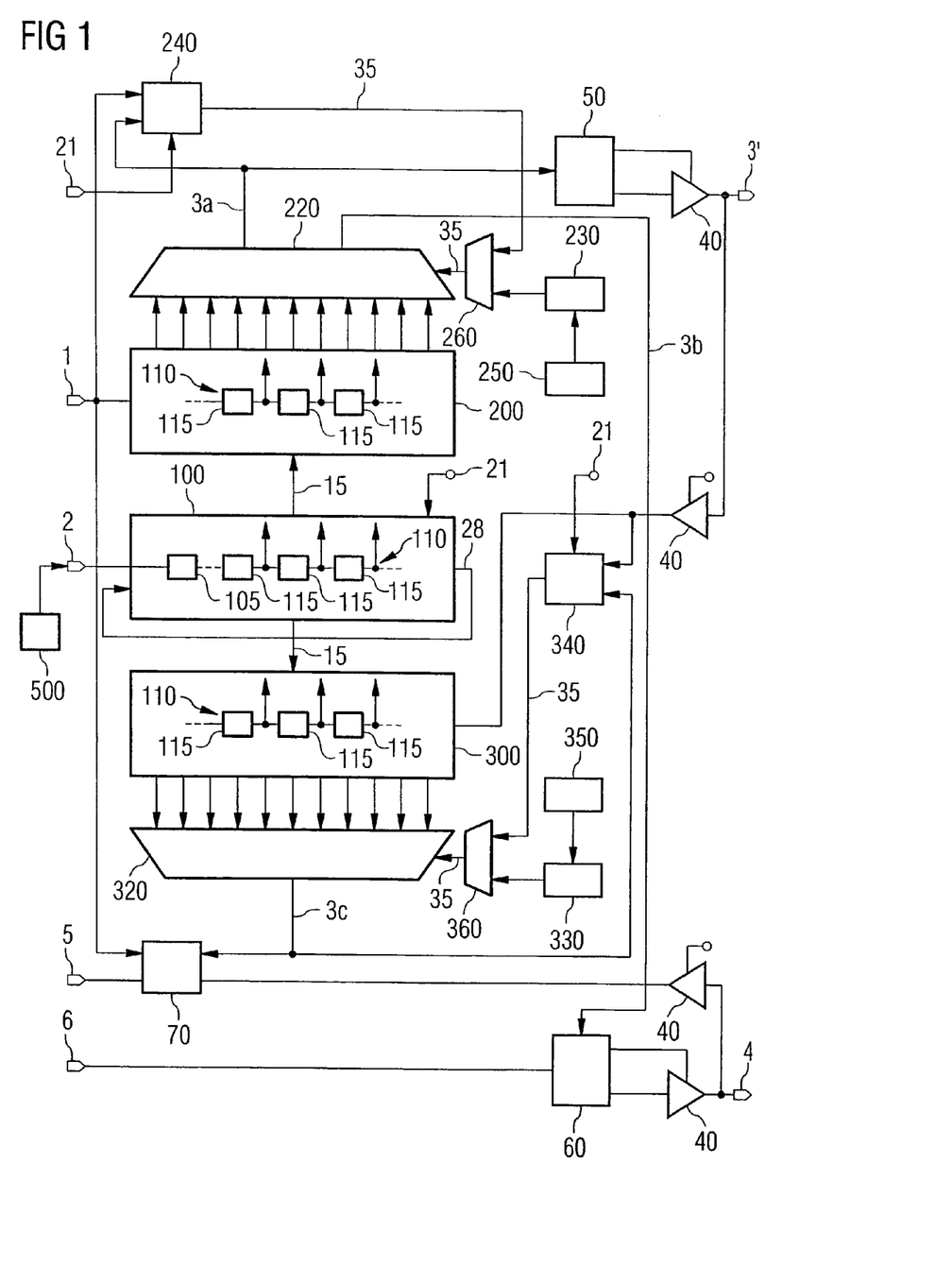
FIG. 1 shows schematically a circuit block for generating and synchronising data and sampling signals in a memory interface according to an embodiment example of the invention.

FIG. 1 shows schematically a circuit block for generating and synchronising data and sampling signals in a memory interface for a memory device. The memory device may be in particular a so-called double data rate memory (DDR memory).

The arrangement illustrated in FIG. 1 comprises a master delay-locked loop 100. The master delay-locked loop 100 delays its input clock signal 2 by a specific amount of time, a defined phase relationship being set between the input clock signal 2 and the delayed input clock signal 2. For this the delay in the master delay-locked loop 100 preferably amounts to a specific fraction of the period length of the input clock signal. The input clock signal 2 of the master delay-locked loop 100 can be supplied, for example, by a phase-locked loop.

To set a fixed phase relationship between the delayed input clock signal 2 and the input clock signal 2 the master delay-locked loop 100 generates internally a digital control signal 15, via which delaying means 110 of the master delay-locked loop 100 are controlled. The digital control signal 15 of the master delay-locked loop 100 is available at signal outputs of the master delay-locked loop 100 and is used to control slave delay-locked loops 200, 300. In order to generate the digital control signal 15, the master delay-locked loop 100 has a digitally configured control circuit. The non-delayed input clock signal of the delaying means of the master delay-locked loop and at least one clock signal delayed by the delaying means 110 of the master delay-locked loop 100 are fed as input clock signals to a comparison means in the form of a binary phase detector. On the basis of a phase comparison of its input signals the binary phase detector generates a digital output signal which reflects the relative phase position of its input signals. A digital control unit of the control circuit, also containing in particular a loop filter, generates the digital control signal 15 on the basis of the digital output signal of the comparison means.

The master delay-locked loop 100 is thus configured in such a way that the input clock signal of the delaying means 110 to be delayed also simultaneously acts as reference clock signal for the phase comparison.

While the master delay-locked loop 100 uses an independently generated clock signal as input clock signal 2, an external clock signal acts as input clock signal 1 of slave delay-locked loop 200 and a sampling signal 3' generated by the memory interface as input clock signal of slave delay-locked loop 300. Output clock signals 3a, 3b, 3c of the circuit block are generated by slave delay-locked loops 200, 300 by the delay of their respective input clock signals. The input clock signal 2 of the master delay-locked loop 100 is generated independently of the external clock signal 1 which acts as input clock signal of slave delay-locked loop 200. However, it has a frequency selected depending on the frequency of the external clock signal 1.

In the present case the input clock signal 2 of the master delay-locked loop 100 has double the frequency of the external clock signal 1, but is modified within the master delay-locked loop 100 by a frequency divider 105 to half the frequency, before it is fed to the delaying means 110 of the master delay-locked loop 100 for delaying. The input clock signals of the delaying means 110 of the master delay-locked loop 100 and slave delay-locked loop 200 thus have the same frequency, but are independent in respect of their phase position. In this way fluctuations in the pulse-duty ratio of the external clock signal 1 do not have a disadvantageous effect on the automatic delay control.

The input clock signal 2 of the master delay-locked loop 100, on the other hand, is deliberately generated with great stability, for example by a phase-locked loop 500. If the input clock signal 2 of the master delay-locked loop is generated with the same frequency as the external clock signal 1, the frequency divider 105 can be omitted.

The delaying means 110 of the master delay-locked loop 100 and of the slave delay-locked loops 200, 300 are formed by identical delay chains with several delay elements 115. The digital control signal 15 generated by the master delay-locked loop 100 controls in particular the delay provided by each of the delay elements 115 of the delaying means 110. By tapping at the outputs of the individual delay elements 115 of the delaying means 110 of the slave delay-locked loops 200, 300, clock signals can be tapped which after adjustment of the master delay-locked loop 100 in each case have a delay corresponding to a defined fraction of the period length of the input clock signal of the delaying means 110 of the master delay-locked loop 100. The output signals of the individual delay elements 115 of the slave delay-locked loops 200, 300 are fed in each case to multiplexer means 220, 320 which generate the output clock signals 3a, 3b, 3c by selection and interpolation of the various delayed clock signals. The delaying means 110 thus supply several differently delayed clock signals simultaneously as output clock signals.

The phase relationship of the output clock signals 3a, 3b, 3c to the external clock signal 1 is set by appropriate controlling of the multiplexer means 220, 320. In this way the phase relationship can be set independently of the delay provided by the delaying means 110.

Output clock signal 3a acts as input signal for a sampling signal generating block 50 which generates the sampling signal 3' on the basis of output clock signal 3a. The sampling signal generating block 50 is substantially configured to provide output clock signal 3a with an envelope, so the sampling signal 3' consists of trains of pulses which have the same frequency and phase position as output clock signal 3a. Output clock signal 3b is fed to a synchronisation block 60 which synchronises write data signals 6 to be written into the memory with output clock signal 3b, in order in this way to generate a memory data signal 4 synchronised with output clock signal 3b for write processes.

While the external clock signal 1 is fed to slave delay-locked loop 200 as input clock signal to be delayed, in the case of slave delay-locked loop 300 the sampling signal 3' acts as input clock signal to be delayed. This demonstrates a particular advantage of the use of delay-locked loops, which in contrast to phase-locked loops do not rely on a fully periodic clock signal being fed to them, but are also suitable for clock-type signals. A desired phase relationship between the scanning signal 3' and output clock signal 3c is thus set for read processes by slave delay-locked loop 300. Output clock signal 3c is fed to a synchronisation block 70 which generates a read data signal 5 synchronised with the external clock signal 1 on the basis of a memory data signal 4 received from the memory. For this the external clock signal 1 is also fed to the synchronisation block 70 as further clock signal.

The synchronisation blocks 60 and 70 thus effect synchronisation of the write and read data signals 5, 6 with the internal clock domain of the memory interface. For this the synchronisation blocks 60, 70 comprise flip-flop elements which are driven by the corresponding clock signals 1, 3b, 3c. The synchronisation blocks 60, 70 further effect adaptation of the bit rate of the signal cables, wherein the write and read data signals 6 may have, for example, a bit rate of 8 bits and the memory data signal 4 has a bit rate of 4 bits. A configuration of this kind is typical of DDR memories which produce the internal communication between the memory and the memory interface at double the data rate of the external communication of the memory interface to other components.

The arrangement illustrated in FIG. 1 thus uses only one master delay-locked loop 100 to supply output clock signals 3a, 3b, 3c with different phase relationships for bi-directional communication with the memory. Further slave delay-locked loops are preferably provided, in order to be able to construct a cluster of four, eight or more memory interfaces, for example, with the same master delay-locked loop 100.

For each interface a slave delay-locked loop corresponding to slave delay-locked loop 200 would then be provided to supply a sampling signal 3' and an output clock signal 3b for synchronising write processes. Furthermore, for each of the interfaces a slave delay-locked loop corresponding to slave delay-locked loop 300 would be provided to supply an output clock signal 3c for synchronising read processes.

For bi-directional use the arrangement of FIG. 1 is provided with switching means 40, by which signal connections, the use of which is not necessary for the intended application, can be interrupted. For example, feeding of the scanning signal 3' to slave delay-locked loop 300 and connection of the data memory signal 4 to the synchronisation block 70 are interrupted during write processes. In this way unnecessary loading of the sampling signal output and the memory data signal output can be avoided and bi-directional data transmission is possible with the memory data signal 4.

The arrangement illustrated in FIG. 1 can additionally comprise further slave delay-locked loops, which are configured corresponding to slave delay-locked loops 200 or 300, but are used in generating and synchronising control clock signals and command and addressing signals.

The multiplexer means 220, 320 of the slave delay-locked loop 200 or 300 are controlled by a phase selection control signal 35 which is suitable for effecting the suitable selection and interpolation of the differently delayed output signals of the outputs of the delay elements 115 in the multiplexer means 220, 320. To generate the phase selection control signal 35, the arrangement illustrated in FIG. 1 comprises a phase setting control means 240 for slave delay-locked loop 200 and a phase setting control means 340 for slave delay-locked loop 300. The input clock signal 1, 3' of the respective slave delay-locked loop 200 or 300 and the corresponding output clock signal 3a or 3c are fed to the phase setting control means 240, 340. The input signals of the phase setting control means 240, 340 are compared in respect of their relative phase position and a phase selection control signal 35 is generated on the basis of the comparison. If the determined phase position differs from the desired phase position, a correspondingly changed phase selection control signal 35 is generated for the multiplexer means 220, 320.

The phase selection control signal 35 generated by the phase setting control means 240, 340, is not, however, fed directly to the multiplexer means 220 or 320, but first fed to a multiplexer 260 or 360. The multiplexer 260, 360 has as additional input signal a phase selection control signal which is generated by a control register 230 or 330. The control register 230, 330 can be loaded via memories 250 or 350 with an appropriate value, which is preferably selectable from a list. In this way, by means of the multiplexers 260, 360, either the dynamically automatically controlled phase selection control signal 35 or a fixed selected phase selection control signal can be used to control the multiplexer means 220, 330.

A control signal 21, which can be used to "freeze" the automatic control of the phase relationship via the dynamic phase selection control signal 35, is fed to the phase setting control means 240, 340 in each case. Freezing the automatic control in this case means that further automatic control of the phase relationship is suspended and the last value adopted for the dynamic phase selection control signal 35 is retained.

Figure 2:
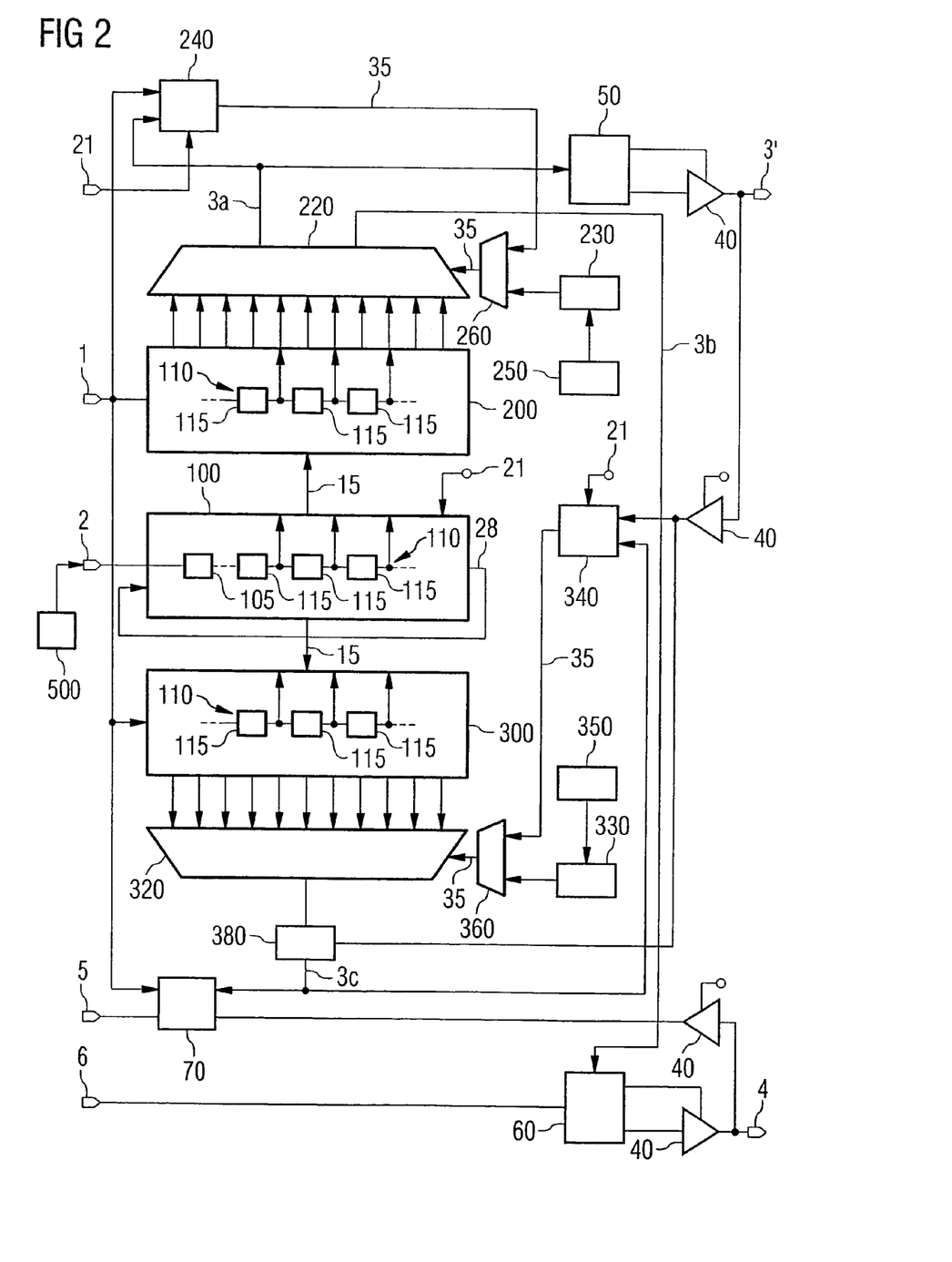
FIG. 2 shows schematically an alternative structure of the circuit block for generating and synchronising data and sampling signals according to an embodiment example of the invention.

FIG. 2 shows an alternative embodiment example of the circuit block illustrated in FIG. 1. The components of this alternative embodiment basically correspond to those already explained in connection with FIG. 1, so there is no need for repeated explanation at this point. In this case the essential difference from the embodiment example illustrated in FIG. 1 is that it is not the sampling signal 3' which is fed to slave delay-locked loop 300 as input clock signal, but the external clock signal 1. Output clock signal 3c is in this case generated by an AND-operation on the sampling signal 3' and the delayed output clock signal of the multiplexer means 320 in the linkage block 380. In this way it is achieved that output clock signal 3c, which in this case is generated on the basis of the external clock signal 1, like the sampling signal 3', represents a train of pulses, i.e. not a fully periodic signal. This is also the case with the embodiment example of FIG. 1, but there it is achieved in that the input clock signal of slave delay-locked loop 300 is formed by the sampling signal 3'.

Both in the arrangement illustrated in FIG. 1 and in the arrangement illustrated in FIG. 2 the result is that output clock signal 3c has a correspondingly delayed train of pulses only when the sampling signal 3' also has a train of pulses. The phase relationship of output clock signal 3c is set in both cases in respect of the sampling signal 3'. For this, as well as output clock signal 3c, the sampling signal 3' is also fed to the phase setting control means 340 as input signal for phase comparison in the embodiment example of FIG. 2.

Figure 3:
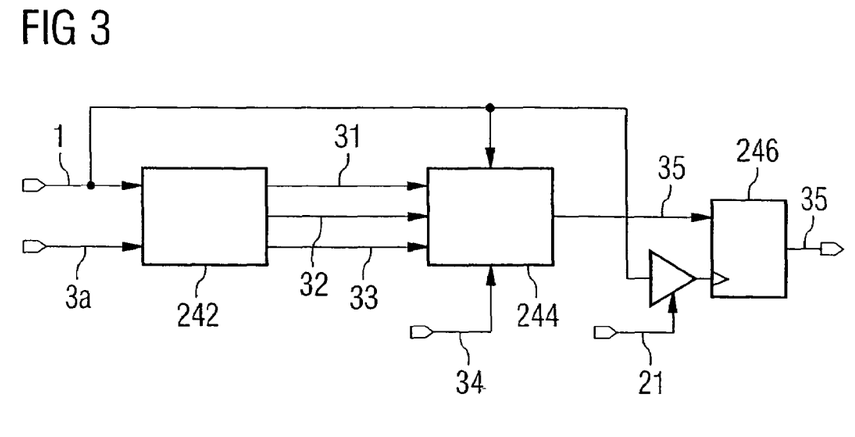
FIG. 3 shows the structure of phase setting control means according to an embodiment example of the invention.

FIG. 3 shows the structure of the phase setting control means 240 from FIG. 1 and FIG. 2. The phase setting control means 240 are digitally configured and comprise a binary phase detector 242, to which the external clock signal 1 and output clock signal 3a are fed as input clock signal. Based on the phase comparison of its input signals, the binary phase detector 242 generates digital output signals 31, 32, 33 which reflect the relative phase position of the input signals of the binary phase detector 242. A first signal 31 is set when the relative phase of the input signals of the binary phase detector 242 is greater than a preset value. A second output signal 32 is set in the case where the relative phase of the input signals of the binary phase detector 242 corresponds to the preset phase relationship. A third output signal 33 of the binary phase detector 242 is set when the relative phase of the input signals of the binary phase detector is smaller than the preset value.

The output signals 31, 32, 33 of the binary phase detector 242 are fed to a control signal generating block 244, which generates the dynamic phase selection control signal 35 based on the output signals 31, 32, 33 and a further phase offset signal 34. The control signal generating block 244 is digitally configured and further contains a loop filter which guarantees the stability of the automatic control circuit for automatic control of the phase relationship via the phase setting control means 240.

A desired value for the phase relationship can be flexibly preset with the phase offset signal 34, differing from the value for the phase relationship preset by the configuration of the binary phase detector 242. In this way the binary phase detector 242 can be implemented in a simple configuration which constantly generates the output signals 31, 32, 33 for a specific preset value of the phase relationship, for example 90°, in the previously described way. A value differing from this preset value of the phase relationship is then subsequently taken into account in generating the phase selection control signal 35 in the control signal generating block 244.

The phase selection control signal 35 is fed to an output register 246 as digital control signal, wherein with each clock of the external clock signal 1 a new value can be adopted at the signal output of the output register 246. For this the external clock signal 1 is fed in the clock input of the output register 246. Additionally, the control signal 21 is fed to the clock input of the output register 246, so that the value of the output register 246 can be kept at a specific value by the control signal 21. Hereby, the already mentioned freezing of the automatic control of the phase relationship is achieved, whereby it can be achieved, for example, that after stable setting of the phase relationship further automatic control processes no longer impair data transmission from/to the memory. The phase setting control means 340 are constructed corresponding to the phase setting control means 240 described using FIG. 3, wherein in this case, however, the input signals of the phase setting control means 340 are formed by the sampling signal 3' and output clock signal 3c.

Besides freezing the automatic control of the phase relationship by the phase setting control means 240, 340, it is also possible to freeze the control of the delay supplied by the delaying means 110 by means of the master delay-locked loop 100 by an appropriate control signal.

Figure 4:
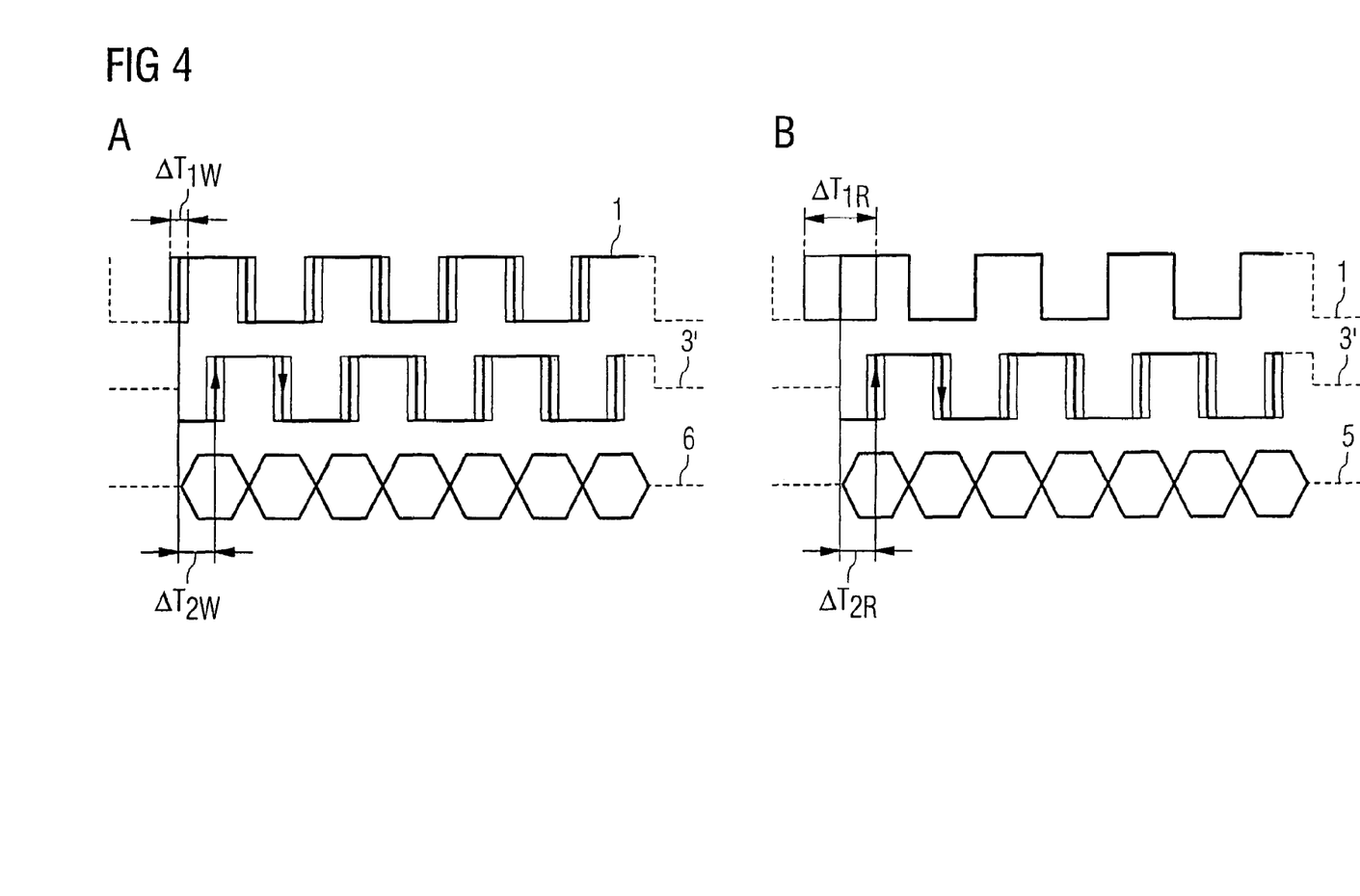
FIG. 4 depicts the time-dependent behaviour of clock, sampling and data signals during read or write processes of the memory interface.

FIG. 4 depicts the time-dependent behaviour of the external clock signal 1, the sampling signal 3' and the write or read data signals 6, 5 during write or read processes. Time-dependent fluctuation widths of the signal edges of the external clock signal 1 and of the sampling signal 3' are marked by highlighted areas on the signal edges.

A illustrates the case of a write process, the possible time-dependent fluctuation width of the signal edges of the external clock signal 1 being designated by $\Delta T_{1W}$. The sampling signal 3' has a similar time-dependent fluctuation width of its signal edges. The time shift between the external clock signal 1 and the sampling signal 3' is designated by $\Delta T_{2W}$. It basically corresponds to a phase shift of 90° and thus guarantees that the sampling signal 3' has the desired phase position in respect of the write data signal 6. The write data signal 6 is in this case illustrated including its complementary signal, so that two "eyes" emerge for a period of the write data signal 6, representing elementary information units or the symbols of the write data signal 6. The phase relationships between the signals are set in such a way that signal edges of the sampling signal 3' coincide chronologically with the eyes of the write data signal 6. To guarantee this, the phase relationship between the external clock signal 1 and the scanning signal 3' is correspondingly controlled.

B illustrates the case of a read process. The time-dependent fluctuation width of the signal edges of the external clock signal 1 is in this case designated by $\Delta T_{1R}$. It can be seen in particular that the time-dependent fluctuation width of the signal edges of the external clock signal 1 can be considerably larger than in the case of a write process illustrated by A. The read data signal 5 is likewise illustrated including its complementary signal, so that again the eyes emerge as elementary information units. For the read process too the phase relationship between the external clock signal 1 and the sampling signal 3' is controlled to a desired value, so that the chronological fluctuations of the signal edges of the external clock signal 1 as far as possible do not impair the read process.

Figure 5:
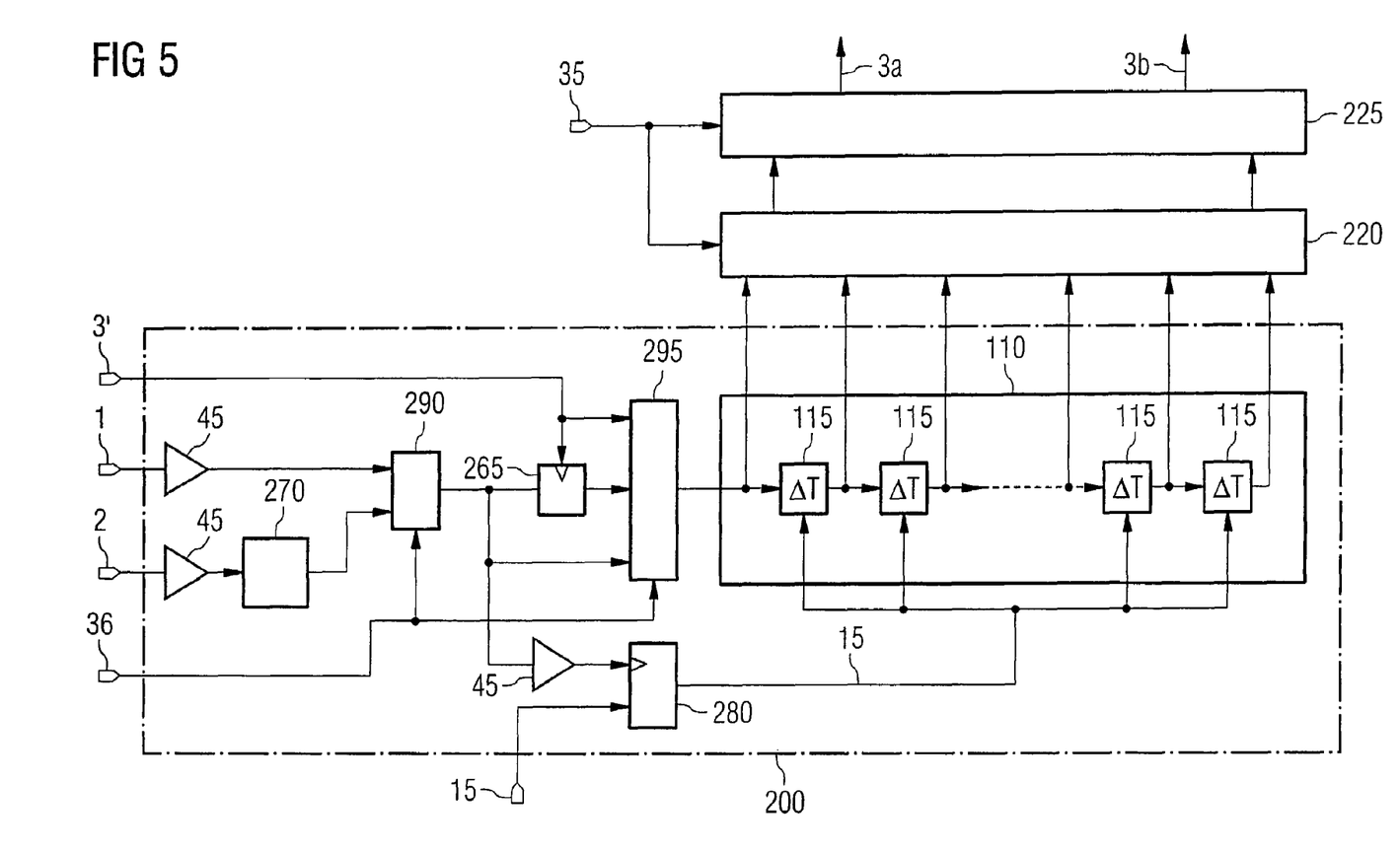
FIG. 5 shows the structure of a slave delay-locked loop according to an exemplary embodiment of the invention.

FIG. 5 shows the structure of slave delay-locked loop 200. The external clock signal 1 is fed to a first multiplexer 290 of the slave delay-locked loop 200 via a buffer 45. The output signal of the first multiplexer 290 is forwarded to a second multiplexer 295 of slave delay-locked loop 200 either directly or via a flip-flop element 265. The output signal of the second multiplexer 295 is fed to the delaying means 110 of the slave delay-locked loop 200. The input clock signal of the delaying means 110 and the respective output signals of the delay elements 115 of the delaying means 110 are fed to the multiplexer means 220. Depending on the phase selection control signal 35, two of the output signals of the delaying means 110 are forwarded to an interpolator 225, which generates output clock signals 3a, 3b by interpolation of its two input signals. The interpolator 225 is likewise controlled by the phase selection control signal 35 and thus guarantees fine setting of the phase relationship between the output clock signals 3a, 3b and the external clock signal 1.

In contrast to the master delay-locked loop 100, in slave delay-locked loop 200 no separate control circuit is provided. Control of the delay elements 115 of the delaying means 110 is instead done by the same digital control signal 15 which is used internally by the master delay-locked loop 100. For this the digital control signal 15 is taken from the master delay-locked loop 100 as output signal and fed to slave delay-locked loop 200 as input signal. The digital control signal 15 is stored in a control register 280 of slave delay-locked loop 200. The control register 280 is controled by the clock signal which can be tapped at the output of the first multiplexer 290 via a buffer 45. In the normal operating mode of slave delay-locked loop 200 this clock signal is the external clock signal 1.

It is further possible with slave delay-locked loop 200 to feed the further clock signal 2, which acts as input clock signal of the master delay-locked loop 100 and is fed to a frequency halver 270 via a buffer 45, into the delaying means 110 via the first multiplexer 290 and second multiplexer 295. It is further possible, instead of the external clock signal 1, to feed the sampling signal 3' into the delaying means 110 by means of the multiplexer 295. This results in the mode of operation as was explained in the case of slave delay-locked loop 300 with reference to FIG. 1. Slave delay-locked loop 300 can thus correspond in its structure to slave delay-locked loop 200 as was explained with reference to FIG. 5. The input clock signal of slave delay-locked loop 200 to be delayed, i.e. the external clock signal 1, the further clock signal 2 with halved frequency or the sampling signal 3', can be selected flexibly by means of an input clock selection signal 36 via the multiplexers 290 and 295.

Figure 6:
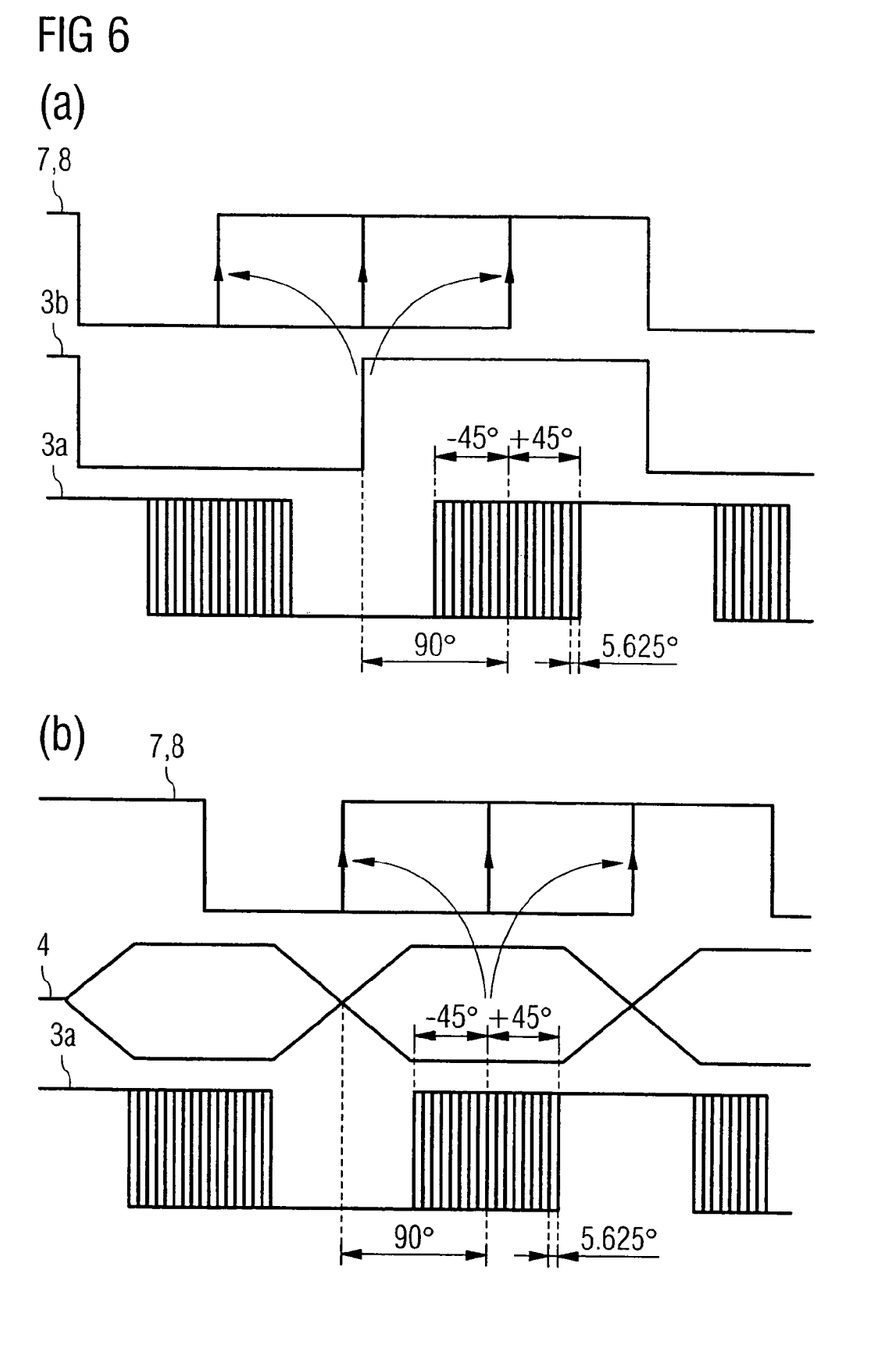
FIG. 6 depicts the setting according to the invention of the phase relationships of control clock, data and sampling signals for a memory device, wherein FIG. 6(*a*) depicts the case of a write operating mode and FIG. 6(*b*) the case of a read operating mode.

FIG. 6 shows the time-dependent behaviour of control clock signals 7, 8 and memory data signals 4 and sampling signals 3' during write or read processes of the memory. FIG. 6(*a*) relates to a write process and FIG. 6(*b*) to a read process, wherein in each case the time-dependent behaviour is illustrated at the output of the memory interface. It is necessary in particular with memories which are read out at a high data rate, e.g. DDR memories, to delay said signals in such a way that the desired phase relationship between the clock, sampling and memory data signals exists at the location of the memory.

FIG. 6(*a*) relates to a write process. Illustrated are the control clock signal 7, 8 of a command and addressing block and also output clock signal 3b for the memory data signals 4 and output clock signal 3a for the sampling signal 3'. Output clock signal 3a basically has a phase shift of 90° in respect of output clock signal 3b. In order to be able to supply the desired phase relationship between the control-clock signals 7, 8 and output clock signals 3a and 3b for the sampling signal 3' or the memory data signal 4 at the location of the memory, output clock signals 3a, 3b are shifted in their phase. This is done by a rough setting of ±45° phase shift and a fine setting which amounts to one eighth of the rough setting, i.e. 5.625°.

During the write process it is the aim to generate the memory data signal 4 on the basis of output clock signal 3b in such a way that edges of the control clock signal 7, 8 coincide chronologically with edges of the memory data signal 4 at the location of the memory.

In FIG. 6(*b*) the corresponding signal courses for a read process are illustrated. In this case it is necessary for output clock signal 3*a* to have a phase shift of 90° in respect of the edges of the memory data signal 4 for the sampling signal 3'. For this again a corresponding delay in respect of the control clock signal 7, 8 has to be supplied. This is again done by the rough setting of ±45° and the fine setting of one eighth, i.e. 5.625° phase shift of output clock signal 3*a*.

The rough setting of the phase relationship by ±45° is achieved in the above-described slave delay-locked loops 200, 300 in that the output clock signal 3*a*, 3*b*, 3*c* is tapped at an appropriate delay element 115.

The delay of the delay elements is in this case adjusted by the master delay-locked loop 100 in such a way that the tapping at the outputs of the delay elements 115 supplies delayed clock signals with a phase position of 45°, 90° and 135° in respect of the non-delayed input-clock signal of the delaying means 110.

The fine setting in steps of 5.625° is achieved by interpolation of the delayed signals of two possible settings for the rough selection of the phase relationship. Even though in FIG. 6 only a phase shift of output clock signal 3*a* or 3*b* is indicated, by means of a further slave delay-locked loop the control clock signals 7, 8 can also be set and controlled separately in their phase position.

Figure 7:
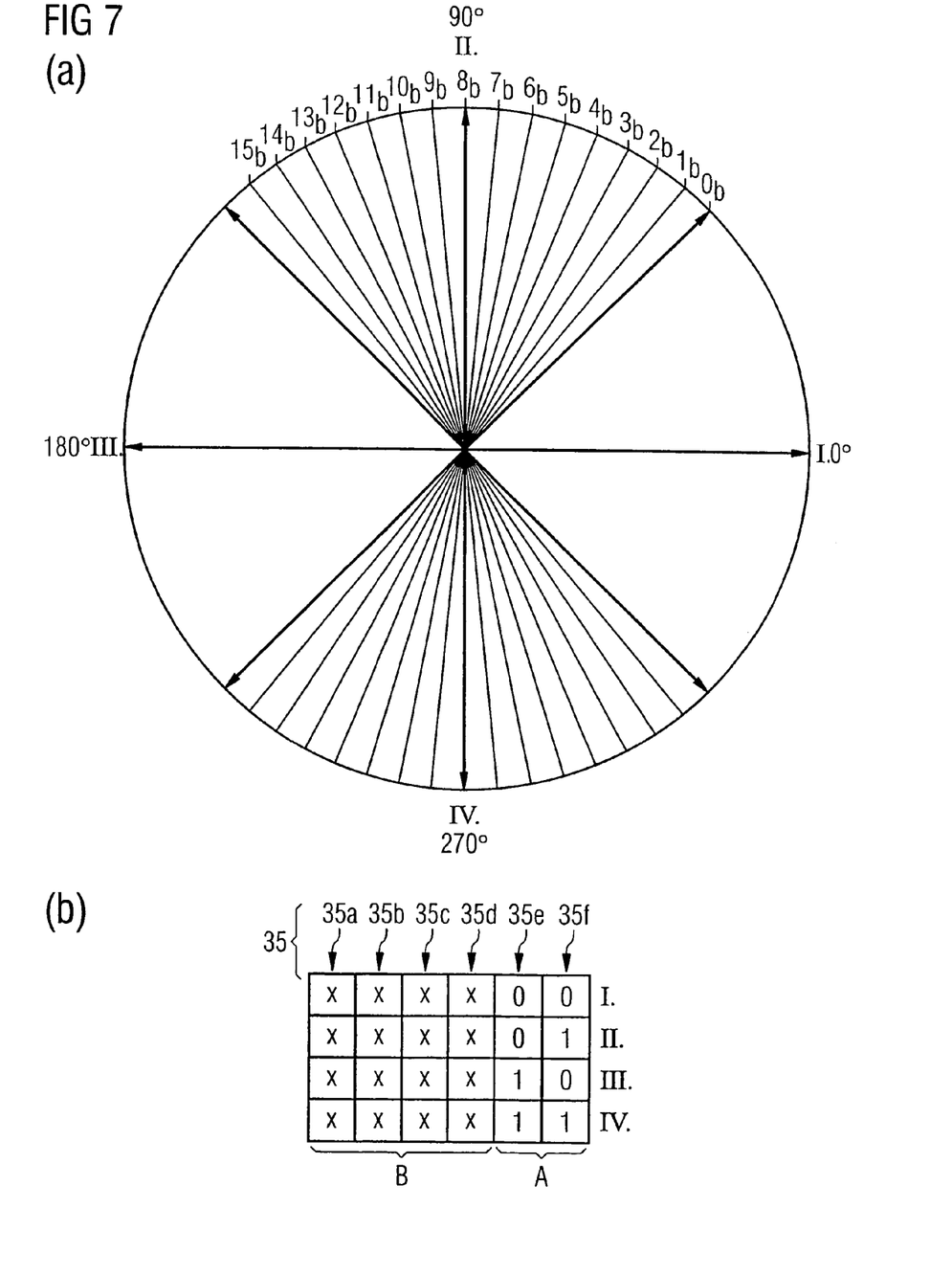

FIG. 7 depicts in a circular diagram the selection of the desired phase position of the output clock signals 3*a*, 3*b*, 3*c* by the phase selection control signal 35. Rough selection of the phase position of the output clock signal is done in steps of 45° by selection of a quadrant. A first quadrant is designated by I. and extends between phase positions of −45° and +45°. 0° would correspond to the respective non-delayed input clock signal to which the phase positions relate. This is normally the external clock signal 1. A phase position of 180° would in turn correspond to the inverted input clock signal. A second quadrant is designated by II. and extends between 45° and 135°. A third quadrant is designated by III. and extends between 135° and 225°. A fourth quadrant is designated by IV. and extends between 225° and 315°. The entire circular diagram is thus covered by quadrants I.-IV.

FIG. 7(*b*) depicts in a table the selection of phase positions from the circular diagram illustrated in FIG. 7(*a*) by means of the phase selection control signal 35. The phase selection control signal 35 comprises for this a first section A of 2 bits, which defines the quadrant in which the phase position to be selected is located. The bit combinations for partial signals 35*e* and 35*f* of the phase selection control signal 35, which define the quadrant, are illustrated in section A of the table. The phase selection control signal 35 comprises a further section B of 4 bits, by which the exact phase position within the quadrant specified in section A is fixed. There thus emerge possible phase positions for each quadrant 16, corresponding to the already explained fine setting of the phase position in steps of 5.625°. If a number N is coded by the section B of the phase selection control signal 35, the phase position results from the beginning of the quadrant plus N times 5.625°.

This fine setting amounts to less than 0.1 ns in currently customary clock rates of DDR memories.

With the described device for automatically controlled delay of clock signals it is possible to cover the entire circular diagram illustrated in FIG. 7(*a*) with phase relationships which can be set by automatic control. It is not necessary for this for the delaying means 110 of the slave delay-locked loops 200, 300 to provide delayed signals of more than 135° phase shift in respect of the reference clock signal, as delayed clock signals with a larger phase shift can be generated by inverting the delayed clock signals by 45°, 90° and 135° and the non-delayed input clock signal.

I claim:

1. A device for setting a clock delay, comprising:
at least one delay circuit configured to delay an input clock signal in order to generate at least one delayed output clock signal of the device, the at least one delay circuit comprising a plurality of delay elements, each providing one of a plurality of differently delayed clock signals;
a delay-locked loop configured to control the delay provided by the at least one delay circuit, the delay-locked loop comprising a comparison unit for a phase comparison of at least one clock signal delayed by a delay circuit of the delay-locked loop with a reference clock signal, the delay-locked loop further comprising a control unit configured to generate a control signal for the at least one delay circuit on the basis of an output signal of the comparison unit, wherein the at least one delay circuit is independent of the delay circuit of the delay-locked loop;
a multiplexer configured to receive the plurality of differently delayed clock signals, the device being configured to generate the at least one delayed output clock signal with a settable phase relationship to the input clock signal by controlling the multiplexer circuit with a phase selection control signal to select between the plurality of differently delayed clock signals; and
a phase setting controller configured to receive the input clock signal and the at least one delayed output clock signal and to generate the phase selection control signal on the basis of a phase comparison between the input clock signal and the at least one delayed output clock signal such that the phase relationship between the at least one delayed output clock signal and the input clock signal is automatically controlled to a desired phase relationship.

2. The device according to claim 1, wherein the reference clock signal of the delay-locked loop is provided independently of the input clock signal of the at least one delay circuit.

3. The device according to claim 2, wherein an input clock signal of the delay circuit of the delay-locked loop is formed by the reference clock signal.

4. The device according to claim 1, wherein the reference clock signal of the delay-locked loop is generated by a phase-locked loop.

5. The device according to claim 1, wherein each of the at least one delay circuits comprises a plurality of delay elements arranged in series, wherein one of the differently delayed clock signals can be tapped at the output of each delay element.

6. The device according to claim 5, wherein the device comprises an interpolation unit, and wherein the device is configured to generate at least one delayed output clock signal by interpolation of at least two of the differently delayed clock signals.

7. The device according to claim 1, wherein the device comprises an interpolator, and wherein the device is configured to generate the at least one delayed output clock signal by interpolation of at least two of the differently delayed clock signals, and wherein the phase selection control signal is suitable for driving the interpolator.

8. A device for setting a clock delay, comprising:
at least one delay circuit configured to delay an input clock signal; in order to generate at least one output clock signal of the device, the at least one delay circuit comprising a plurality of delay elements, each providing one of a plurality of differently delayed clock signals;
wherein the device is configured to generate the at least one output clock signal with a settable phase relationship to the input clock signal based on the differently delayed clock signals, such that the phase relationship can be set independently of the delay provided by the at least one delay circuit;
wherein the device is further configured such that the phase relationship between the at least one output clock signal and the input clock signal is automatically controlled to a desired phase relationship independently of the delay provided by the at least one delay circuit;
a delay-locked loop configured to control the delay provided by the at least one delay circuit, the control of the delay based on a reference clock signal, the reference clock signal provided independently of the input clock signal;
a multiplexer receiving the plurality of differently delayed clock signals, the device being configured to generate the at least one output clock signal with a settable phase relationship to the input clock signal by controlling the multiplexer with a phase selection control signal to select between differently delayed clock signals, such that the phase relationship can be set independently of the delay provided by the at least one delay circuit; and
a phase setting controller configured to received the input clock signal and the at least one output clock signal and to generate the phase selection control signal on the basis of a phase comparison between the input clock signal and the at least one output clock signal such that the phase relationship between the at least one output clock signal and the input clock signal is automatically controlled to a desired phase relationship.

9. The device according to claim 8, wherein the delay-locked loop comprises:
a comparison unit for a phase comparison of at least one clock signal delayed by a delay circuit of the delay-locked loop with the reference clock signal; and
a control unit configured to generate a control signal for the at least one delay circuit on the basis of an output signal of the comparison unit.

10. The device according to claim 8, wherein the reference clock signal of the delay-locked loop is generated by a phase-locked loop.

11. The device according to claim 9, wherein each of the at least one delay circuits comprises a plurality of delay elements arranged in series, wherein one of the differently delayed clock signals can be tapped at the output of each delay element.

12. The device according to claim 8, wherein each of the at least one delay circuits comprises a plurality of delay elements arranged in series, wherein one of the differently delayed clock signals can be tapped at the output of each delay element.

* * * * *